US008629760B2

(12) United States Patent
Liu et al.

(10) Patent No.: US 8,629,760 B2
(45) Date of Patent: Jan. 14, 2014

(54) SIGNAL CONVERSION DEVICE, RADIO FREQUENCY IDENTIFICATION (RFID) TAG, AND METHOD FOR OPERATING THE RFID TAG

(75) Inventors: Chi-En Liu, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 1415 days.

(21) Appl. No.: 12/346,621

(22) Filed: Dec. 30, 2008

(65) Prior Publication Data

US 2009/0267738 A1    Oct. 29, 2009

(30) Foreign Application Priority Data

Apr. 25, 2008    (TW) .............................. 97115202 A

(51) Int. Cl.
*H04Q 5/22*    (2006.01)
(52) U.S. Cl.
USPC ........... 340/10.1; 455/118; 327/118; 332/149
(58) Field of Classification Search
USPC ....................................................... 340/10.1
See application file for complete search history.

(56) References Cited

U.S. PATENT DOCUMENTS

| 7,889,080 B2 * | 2/2011 | Chan ........................ 340/572.1 |
| 2004/0116093 A1 * | 6/2004 | Otaka ........................... 455/313 |
| 2005/0179550 A1 * | 8/2005 | Lian et al. .................. 340/572.5 |
| 2006/0170496 A1 * | 8/2006 | Morohashi ..................... 330/254 |
| 2007/0007342 A1 * | 1/2007 | Cleeves et al. ................. 235/435 |
| 2008/0030336 A1 * | 2/2008 | Endo et al. .................. 340/572.1 |
| 2008/0143446 A1 * | 6/2008 | Yao et al. .......................... 331/45 |
| 2008/0252367 A1 * | 10/2008 | Pettersen et al. .............. 329/311 |
| 2009/0088113 A1 * | 4/2009 | Marsili et al. ................. 455/260 |
| 2009/0203313 A1 * | 8/2009 | Martin ......................... 455/41.1 |

OTHER PUBLICATIONS

Chi-En Liu,"Design of Reader Transmitter and Tag Baseband Circuit for Radio-Frequency Identification", Dec. 2007, National Taiwan University, p. 1-28.*
Chi-En Liu; "Design of Reader Transmitter and Tag Baseband Circuit for Radio-Frequency Identification"; Master Thesis—National Taiwan University; Dec. 2007; 32 pages.

* cited by examiner

*Primary Examiner* — George Bugg
*Assistant Examiner* — Anthony D Afrifa-Kyei
(74) *Attorney, Agent, or Firm* — Edwards Wildman Palmer LLP; Peter F. Corless; Steven M. Jensen

(57) ABSTRACT

A signal conversion device, a radio frequency identification (RFID) tag, and a method for operating the RFID tag. The RFID tag has an electrically erasable programmable read-only memory module for storing RFID tag information and transmitting the RFID tag information; an information comparison module coupled to the electrically erasable programmable for receiving the RFID tag information and demodulation information, comparing the RFID tag information with the demodulation information, and generating a driving signal; and a pulse oscillation module coupled to the information comparison module for receiving the driving signal, and transmitting pulse oscillating signals to the electrically erasable programmable read-only memory module, so as to allow the electrically erasable programmable read-only memory module to transmit the RFID tag information.

10 Claims, 14 Drawing Sheets

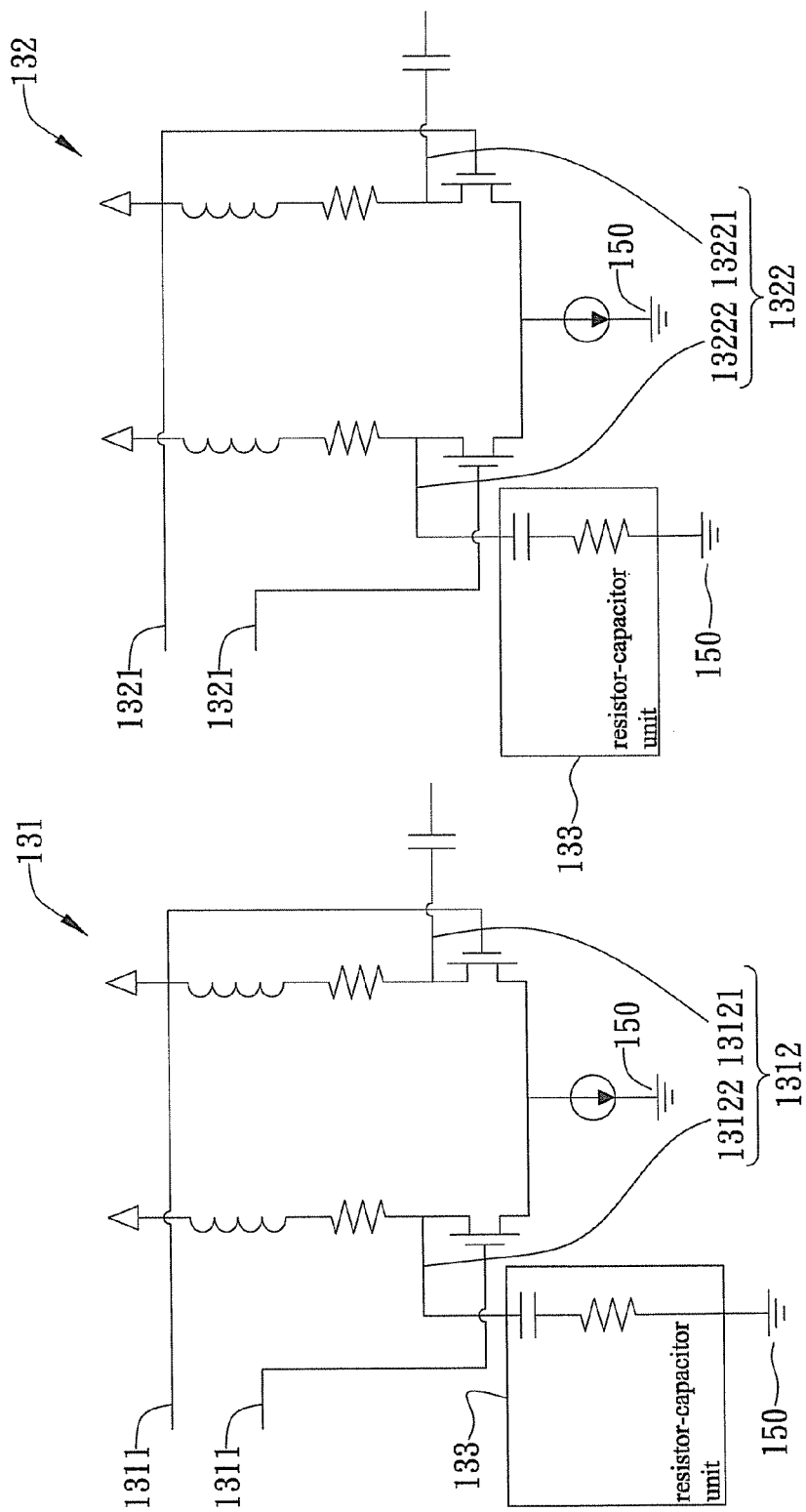

SIGNAL CONVERSION DEVICE, RADIO FREQUENCY IDENTIFICATION (RFID) TAG, AND METHOD FOR OPERATING THE RFID TAG

BACKGROUND OF THE INVENTION

1. Field of the Invention

The present invention relates to a signal conversion device, and more particularly to a wireless RF signal conversion device. The present invention relates to a radio frequency tag and the method for operating the same, and more particularly to a radio-frequency tag having the information for comparing digital logic and the method for operating the same.

2. Description of Related Art

The Radio-Frequency Identification (RFID) system has been recognized as a major development trend in the electronic industry, and the system is designed based on different modulation methods such as OOK (100% ASK), x % ASK, FSK, PSK and FHSS as required, thereby achieving different signal transmission formats.

In particular, BPSK is a signal modulation mode that has an uninterrupted transmission capacity, a high data rate, and a noise immunity property; therefore it has been widely used in various techniques involving wireless signal transmission. However, BPSK signal format is more complex, thus it is more complicated to decode the BPSK signal to obtain the baseband digital information contained therein.

Hence, BPSK signal reading device usually requires a microprocessor to demodulate the signal. However, to a simple passive RFID tag circuit that is unable to use the microprocessor for demodulation, a low-cost and power-saving BPSK signal conversion device must be designed to extract the baseband digital information contained in the BPSK signal.

Referring to FIG. 1, a block diagram of a conventional BPSK demodulation structure is shown. As illustrated in the diagram, the general demodulation structure is realized using digital circuits, which has the advantages of lower power dissipation and easier circuit design compared to the structure based on the conventional Costas loop.

The concept of the demodulation structure design is based on the XOR gate, which replaces the product detector of the conventional Costas loop and a feedback modulator is used to replace the function of the original phase detector, so as to lower the circuit complexity.

However, the problem of demodulation error often occurs in such circuit structure, a data decoder must be used to compensate the demodulation signal, or even worse, a microprocessor is sometimes needed to perform the signal compensation algorithm. Therefore, such a circuit structure may have the advantage of circumventing analog components but it increases the design complexity.

In addition, lowering the manufacturing cost of the passive RFID tag to the level appropriate for mass production is an issue worth discussing in the event that the wireless RFID system is promoted such that it replaces the current bar code system for use in the inventory tracking or product identification management systems.

For instance, considering the conventional RFID tag reading method shown in FIG. 2, the method adopts a scanning-based pre-processing structure to achieve lower probability of tag collisions.

The core of the design involves issuing an inquiry signal to the RFID tag by the tag reader prior to authentication. Subsequently, the RFID tag sends its ID back to the tag reader. The tag reader, after receiving the ID of the RFID tag, analyzes the ID and the positions where collisions occur. Finally, the positions where collisions occur will be sent back and saved in the memory of the RFID tag. Thereafter, ID authentication is carried out based on uncollided bits.

The RFID tag system designed based on the aforementioned design core solves the bit collision problem and lowers the communication time, however, the collision information sent back by the tag reader is required to be saved in the RFID tag, therefore a storage device for storing information must be designed into the RFID tag. Sometimes, a microprocessor must be used to run the algorithm, and thus the manufacturing cost is increased, which impedes the progress of replacing the current bar code ID management system.

In summary, it has become a critical issue to designers of the RFID tag to propose a low-cost BPSK signal conversion device that dissipates low power to extract the baseband digital information contained in the BPSK signal, as well as a simple, correct and fast passive wireless RFID tag and the method for operating the same so as to circumvent the tag collision problem and lower the RFID tag manufacturing cost.

SUMMARY OF THE INVENTION

In view of the above disadvantages of the conventional technique, it is a primary objective of the present invention to provide a signal conversion device including a signal distribution module, a first injection-locked cross-coupled oscillation module, a second injection-locked cross-coupled oscillation module, a first differential amplification module, a second differential amplification module and a signal comparison module. In one embodiment, the signal distribution module is a Wilkinson power divider, and the signal comparison module is a Wilkinson power combiner.

In particular, both the injection-locked cross-coupled oscillation modules have an oscillating signal input terminal, a locking signal input terminal and an oscillating signal output pair. In addition, the two oscillating signal input terminals are connected to one output terminal of the signal distribution module, respectively.

Also, both the differential amplification modules have a signal input pair and a signal output pair. The signal input pair of the first differential amplification module is connected to the oscillating signal output pair of the first injection-locked cross-coupled oscillation module, and the signal input pair of the second differential amplification module is connected to the oscillating signal output pair of the second injection-locked cross-coupled oscillation module.

Each input terminal of the signal comparison module is connected to one signal output end of the signal output pair of the first differential amplification module and one signal output end of the signal output pair of the second differential amplification module. The ASK demodulation signal is generated by comparing the output signals of the two output ends.

In the signal demodulation device of the present invention, the signal distribution module further includes an input terminal for receiving signals and an output pair for distributing signals. The input terminal serves to receive the received signal for demodulation. Each terminal of the output pair of signal distribution module is respectively connected to the two oscillating signal input terminals. The signal comparison module further has a demodulation signal output terminal for transmitting the ASK demodulation signal.

The first injection-locked cross-coupled oscillation module further includes a first NPN transistor and a second NPN transistor, the base of the first NPN transistor is coupled to the collector of the second NPN transistor, the base of the second NPN transistor is coupled to the collector of the first NPN transistor, and the emitter of the first NPN transistor is coupled to the emitter of the second NPN transistor to form a first connection node.

Also, the first connection node is the oscillating signal input terminal of the first injection-locked cross-coupled oscillation module. The collectors of the first NPN transistor and the second NPN transistor together form an oscillating signal output pair of the first injection-locked cross-coupled oscillation module.

In addition, a first capacitor unit and a first inductor unit are connected in parallel between the collectors of the first NPN transistor and the second NPN transistor. The first capacitor unit further includes a variable capacitor unit, which further has a varactor diode and a first capacitor operating bias voltage. Also, the first capacitor operating bias voltage source is coupled to the varactor diode to adjust the capacitance of the variable capacitor unit.

Likewise, the second injection-locked cross-coupled oscillation module in the signal demodulation device of the present invention further includes a third NPN transistor and a fourth NPN transistor. The base of the third NPN transistor is coupled to the collector of the fourth NPN transistor, the base of the fourth NPN transistor is coupled to the collector of the third NPN transistor, and the emitter of the third NPN transistor is coupled to the emitter of the fourth NPN transistor to form a second connection node.

Furthermore, the second connection node forms the oscillating signal input terminal of the second injection-locked cross-coupled oscillation module, and the collectors of the third NPN transistor and the fourth NPN transistor form the oscillating signal output pair of the second injection-locked cross-coupled oscillation module.

Besides, a second capacitor unit and a second inductor unit are connected in parallel between the collectors of the third NPN transistor and the fourth NPN transistor. The second capacitor unit further includes a variable capacitor unit, which is further provided with a varactor diode and a second capacitor operating bias voltage. The second capacitor operating bias voltage source is coupled to the varactor diode for adjusting the capacitance of the variable capacitor unit.

Moreover, the signal demodulation device of the present invention further includes a volt current condenser (Vcc), a ground terminal, a first operating current source and a first injection-locked signal source, wherein the first operating current source is connected in series between the first connection node and the ground terminal. The current of the operating current source flows in a direction from the first connection node to the ground terminal. Also the Vcc and the first injection-locked signal source are coupled to the first inductor unit.

Likewise, the signal demodulation device of the present invention further includes a volt current condenser (Vcc), a ground terminal, a second operating current source and a second injection-locked signal source. In particular, the second operating current source is connected in series between the second connection node and the ground terminal. The current of the operating current source flows in a direction from the second connection node to the ground terminal. Also the Vcc and the second injection-locked signal source are coupled to the second inductor unit.

In addition, in the signal demodulation device of the present invention, a resistor-capacitor unit is respectively coupled between the other signal output end of the signal output pair of the first differential amplification module and the ground terminal as well as the other signal output end of the signal output pair of the second differential amplification module and the ground terminal.

The signal demodulation device of the present invention also includes a first lowpass filter module and a second lowpass filter module, wherein the first lowpass filter module is connected in series between the signal output end of the signal output pair of the first differential amplification module and the signal comparison module, and the second lowpass filter module is connected in series between the signal output end of the signal output pair of the second differential amplification module and the signal comparison module.

The first and second lowpass filter modules includes a signal input terminal and a signal output terminal, wherein the signal input terminal of the first lowpass filter module is coupled to one signal output end of the signal output pair of the first differential amplification module, the signal input terminal of the second lowpass filter module is coupled to one signal output end of the signal output pair of the second differential amplification module, and the signal output terminals of the first and second lowpass filter modules are coupled to one terminal of the signal comparison module, respectively.

In one embodiment, the signal demodulation device of the present invention further includes a packet detection module, wherein the packet detection module has a single-amplifier biquadratic filter and a comparator.

The packet detection module is coupled to the signal comparison module and receives the ASK modulation signal transmitted from the signal comparison module. The packet detection module filters out the carrier signal of the ASK modulation signal using the single-amplifier biquadratic filter, and then uses the comparator to adjust the signal offset of the ASK modulation signal after the removal of carrier signal.

Another objective of the present invention is to provide an RFID tag having an electrically erasable programmable read-only memory (EEPROM) module, an information comparison module, and a pulse oscillation module.

The EEPROM module stores RFID tag information as well as transmits the RFID tag information. The information comparison module generates a driving signal, as well as receives the demodulation signal and the RFID tag information, so as to compare the RFID tag information with the demodulation signal. The pulse oscillation module receives the driving signal, and transmits pulse oscillating signals to the electrically erasable programmable read-only memory module, so as to allow the electrically erasable programmable read-only memory module to transmit the RFID tag information.

The RFID tag of the present invention further includes a T/R antenna, a front-end signal demodulation module and a backend signal modulation module, wherein the front-end signal demodulation module further has a signal rectification unit, a signal demodulation unit and a logic circuit activation unit.

In particular, the signal rectification unit serves to receive RF signals, thereby rectifying the received RF signals to a dc voltage; the signal demodulation unit is for receiving RF signals which are further demodulated into ASK modulation signals; the logic circuit activation unit activates the information comparison module.

Also, the backend signal modulation module receives the RFID tag information, which is further modulated to form the BPSK modulation signal of the RFID tag information. In addition, the T/R antenna is used for receiving RF signals, which is then sent to the front-end signal demodulation module. The T/R antenna is also used for receiving the modulation signal of the RFID tag information, which is in turn transmitted Another objective of the present invention is to provide an operation method for RFID tag. First of all, a driving signal is generated after the information comparison module receives the logic circuit activation signals; subsequently, the pulse oscillation module receives the driving signals and generates the pulse oscillating signals; then receiving of the pulse oscillating signals is carried out by the electrically erasable programmable read-only memory module, after which the RFID tag information is transmitted to the information comparison module; the RFID tag information is compared with the demodulated signal after the information comparison module receives the RFID tag information; if the comparison is successful, the electrically erasable programmable read-only memory module is initiated to send the RFID tag information, otherwise the RFID tag is then made to enter the standby mode.

In particular, prior to implementing the method for operating the RFID tag of the present invention, the antenna unit receives RF signals first, and sends the RF signals to the signal rectification unit, thereby rectifying the RF signals to a de voltage; subsequently, the signal demodulation unit demodulate the RE signals to ASK modulation signals; finally, the ASK modulation signals are sent to the information comparison module. It is to be stressed here that after the signal rectification unit receives the RF signals, the rectification process is allowed to activate the dc voltage to drive the logic circuit activation unit such that the information comparison module enters the operation state.

Besides, after the implementation of the method for operating the RFID tag of the present invention is completed, the backend signal modulation module starts to receive the RFID tag information, which is then modulated into a modulation signal of the RFID tag information. Finally, the antenna unit transmits the modulation signal of the RFID information via a wireless transmission means.

Therefore, it is known that the signal distribution module of the aforesaid signal conversion device divides the BPSK signal into two signals of similar strengths, and the two parallel-connected injection-locked oscillation modules lock the two signals at a specified frequency and phase. Subsequently, the signals are amplified and filtered to be converted to the ASK modulation signals. Finally, the packet detection module is employed to identify the phase conversion information of the BPSK signal.

In addition, based on the above-mentioned RFID tag and the method for operating the same, after the RFID tag receives the RE signals, the signal demodulation module is employed to generate the demodulation signal. Comparison is performed based on the demodulation information and the information saved in the RFID tag. If the comparison is matched, the RFID tag will send the tag information to the reading device using a wireless transmission means, otherwise, the RFID tag is forced into the standby mode. The present invention discloses the RFID tag and the method for operating the same, thereby providing a simple, correct, and fast RFID tag circuit design, so as to significantly lower the manufacturing cost of the RFID and raise the possibility of commercialization of the passive RFID tag.

BRIEF DESCRIPTION OF DRAWINGS

FIG. 3d illustrates a first differential amplification module;

FIG. 3e illustrates a second differential amplification module;

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification.

The present invention can also be performed or applied by other different embodiments. The details of the specification may be on the basis of different points and applications, and numerous modifications and variations can be devised without departing from the spirit of the present invention.

Figure 1:
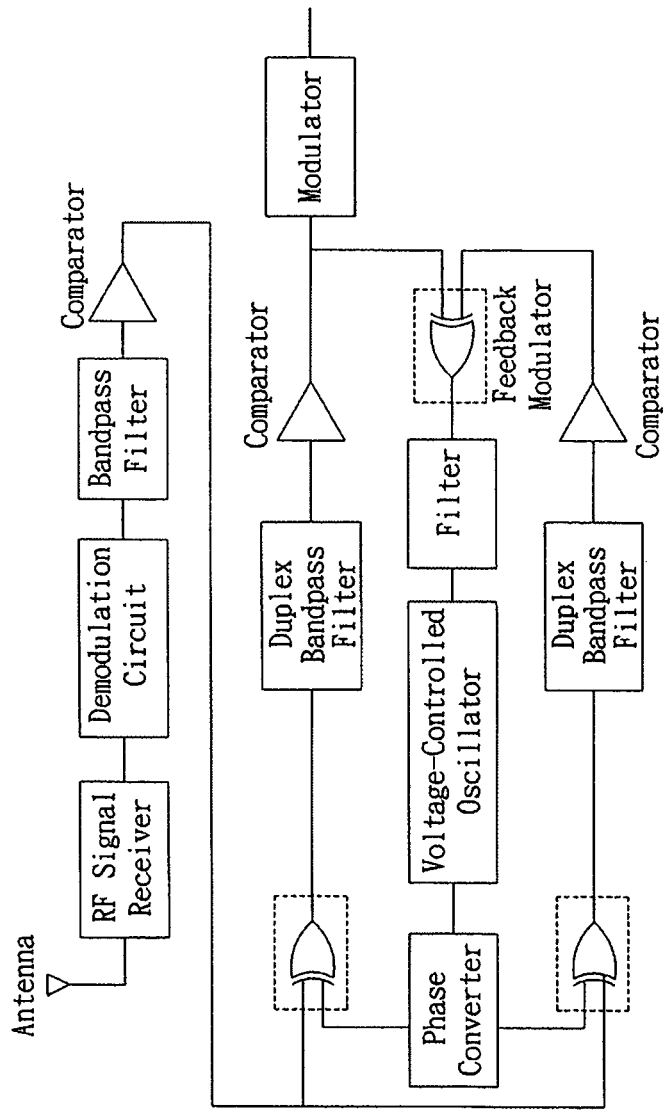
FIG. 1 is a block diagram illustrating a conventional BPSK demodulation.
Figure 2:
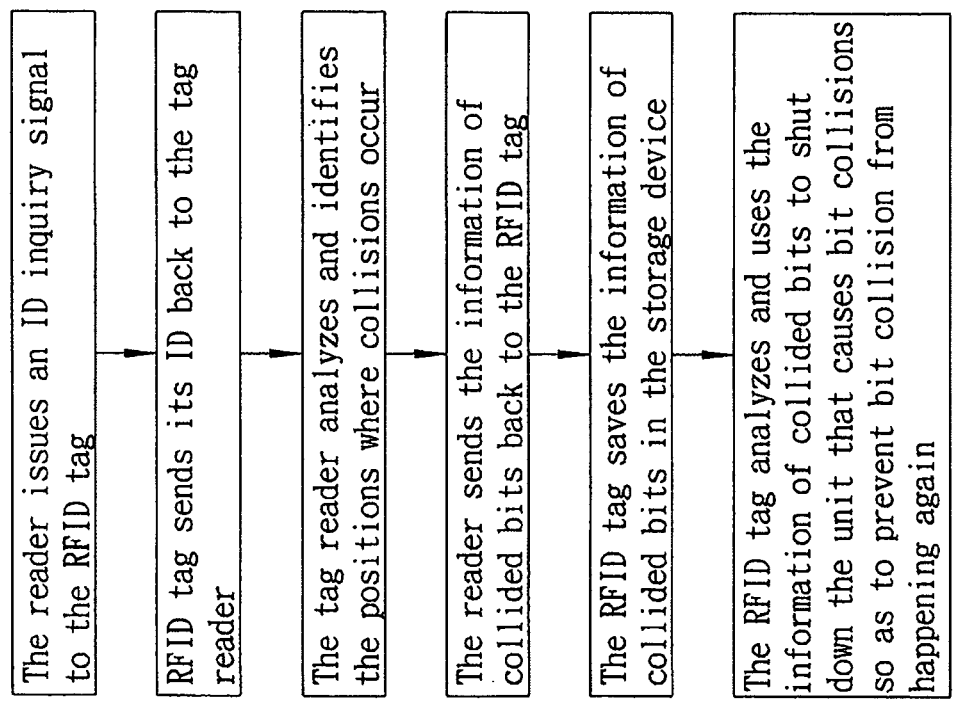
FIG. 2 shows an algorithm of a conventional RFID tag reading method.
Figure 3A:
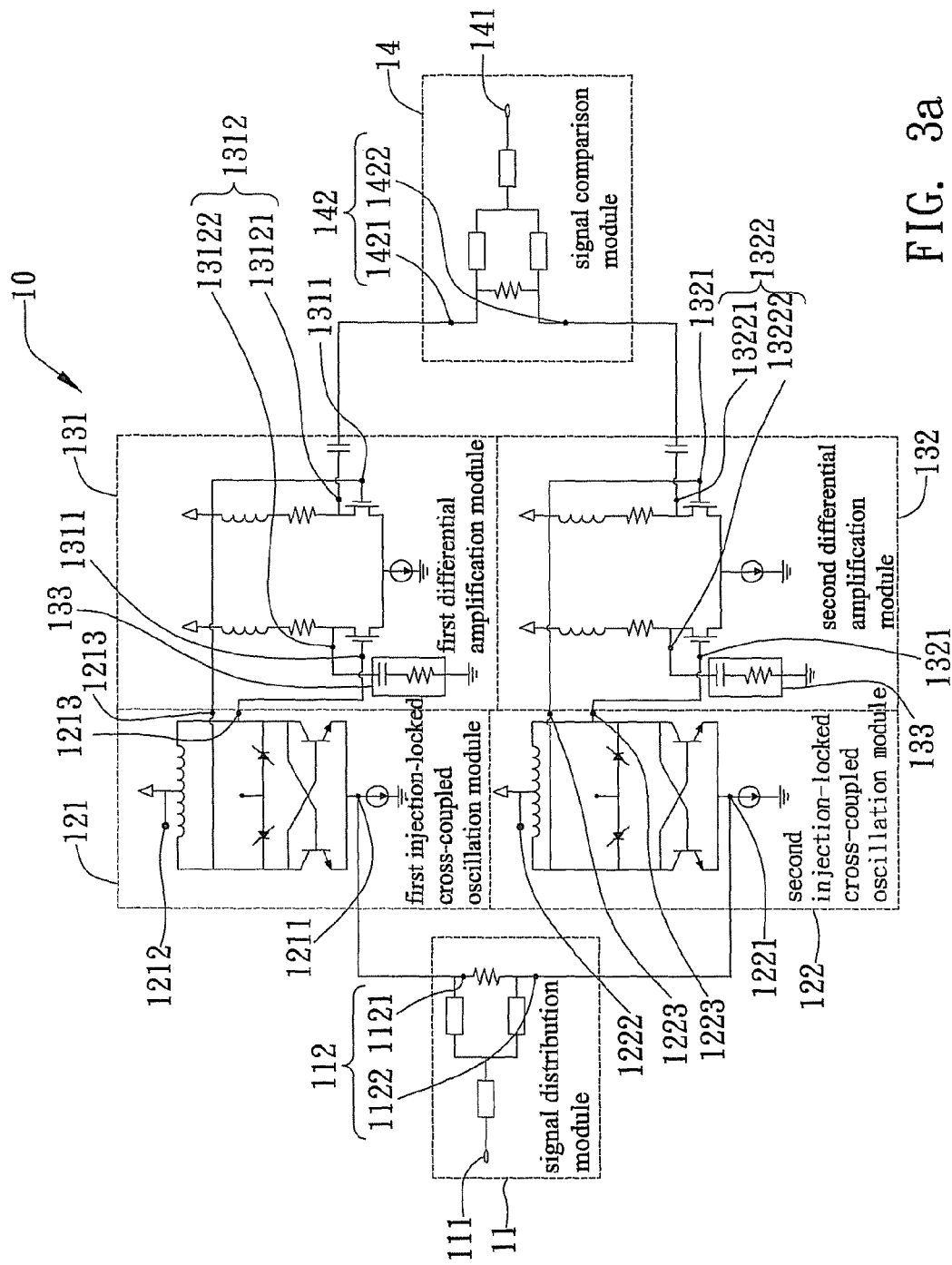
FIG. 3a is a structure of a signal conversion device of the present invention.

FIG. 3a illustrates a block diagram of the signal conversion device of the present invention. As shown in the diagram, a signal conversion device of the present invention includes: a signal distribution module 11, a first injection-locked cross-coupled oscillation module 121, a second injection-locked cross-couple oscillation module 122, a first differential amplification module 131, a second differential amplification module 132, and a signal comparison module 14.

It is to be stressed specifically here that the aforementioned signal distribution module 11 employs a Wilkinson power divider, and the signal comparison module 14 adopts a Wilkinson power combiner.

Also, the signal distribution module includes an RF signal input terminal 111 for the input of RF signals for modulation, and an RF signal output pair 112 having a first signal distribution output end 1121 and a second signal distribution output end 1122; the signal comparison module 14 includes a demodulation signal output terminal 141 for the output of demodulation signal, and a signal input pair 142 having a first demodulation signal input end 1421 and a second demodulation signal input end 1422.

The first injection-locked cross-coupled oscillation module 121 includes a first oscillating signal input terminal 1211, a first locking signal input terminal 1212, and a first oscillating signal output pair 1213; the second injection-locked cross-coupled oscillation module 122 further includes a second oscillating signal input terminal 1221, a second locking signal input terminal 1222 and a second oscillating signal output pair 1223.

In particular, the first signal distribution output end 1121 is connected to the first oscillating signal input terminal 1211, and the second signal distribution output end 1122 is coupled to the second oscillating signal input terminal 1221.

The first differential amplification module 131 includes a signal input pair 1311 and a signal output pair 1312. The second differential amplification module 132 includes a signal input pair 1321 and a signal output pair 1322. The signal input pair 1311 of the first differential amplification module 131 is connected to the first oscillating signal output pair 1213 of the first injection-locked cross-coupled oscillation module 121, the signal input pair 1321 of the second differential amplification module 132 is connected to the second oscillating signal output pair 1223 of the second injection-locked cross-coupled oscillation module 122.

Besides, the signal output, pair 1312 of the first differential amplification module 131 includes a first signal output end 13121 and a second signal output end 13122. The signal output pair 1322 of the second differential amplification module 132 includes a third signal output end 13221 and a fourth signal output end 13222. Also the first signal output end 13121 is connected to the first demodulation signal input end 1421 and the third signal output end 13221 is coupled to the second demodulation signal input end 1422.

Figures 3B, 3C:
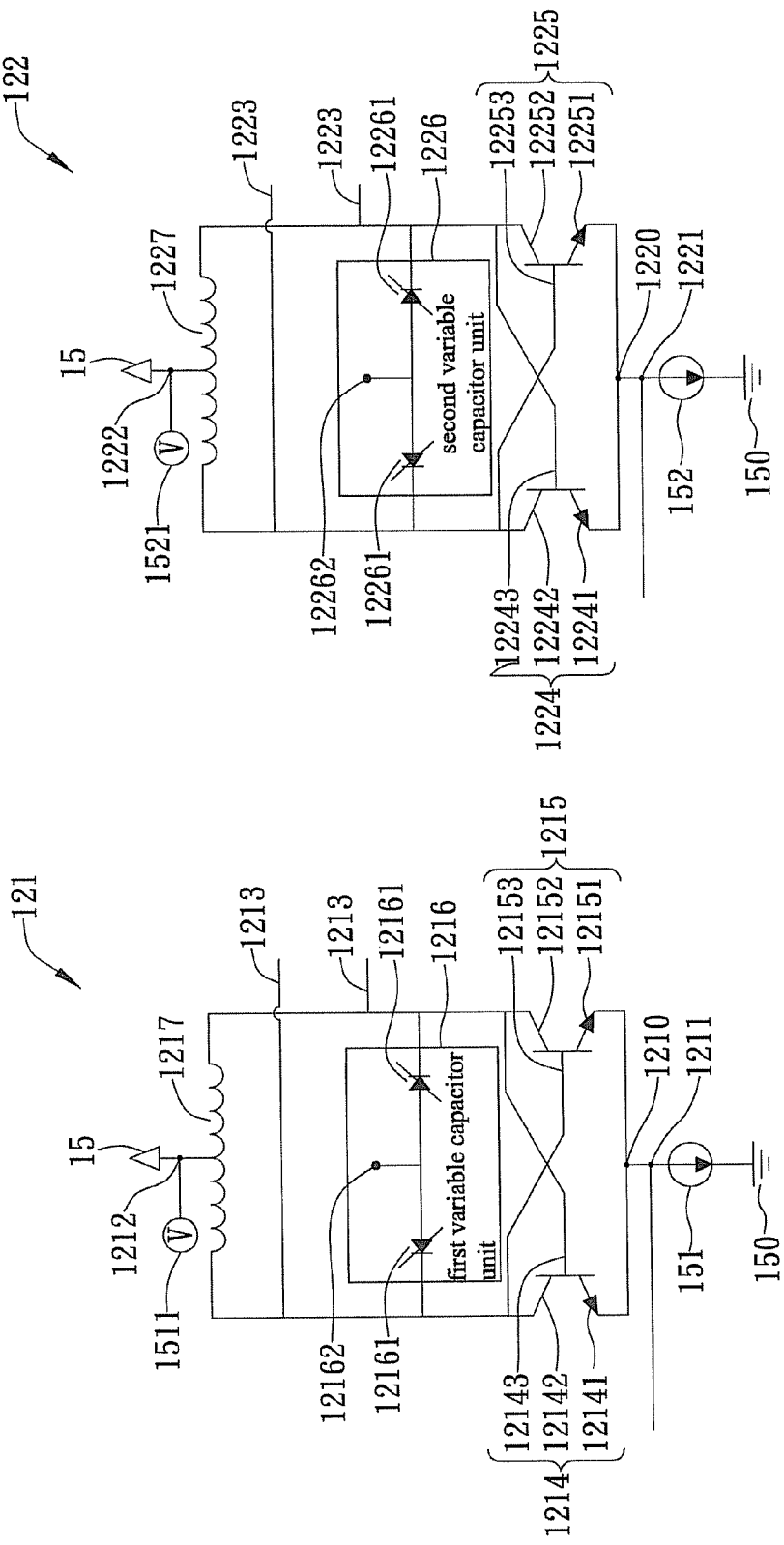
FIG. 3b shows a first injection-locked cross-coupled oscillation module.
FIG. 3c shows a second injection-locked cross-coupled oscillation module.

FIG. 3b is a diagram showing the first injection-locked cross-coupled oscillation module. As shown in the diagram, the first injection-locked cross-coupled oscillation module 121 further includes a first NPN transistor 1214 and a second NPN transistor 1215. Also, the first NPN transistor 1214 has an emitter 12141, a collector 12142 and a base 12143, and the second NPN transistor 1215 has an emitter 12151, a collector 12152, and a base 12153.

In addition, the base 12143 the first NPN transistor 1214 is connected to the collector 12152 of the NPN transistor 1215, the base 12153 of the second NPN transistor 1215 is coupled to the collector 12142 of the first NPN transistor 1214, and the emitter 12141 of the first NPN transistor 1214 is connected to the emitter 12151 of the second NPN transistor 1215. It allows the emitter 12141 of the first NPN transistor 1214 and the emitter 12151 of the second NPN transmitter 1215 to thereby form a first connection node 1210.

Also, the first connection node 1210 is connected to the first oscillating signal input terminal 1211 of the first injection-locked cross-coupled oscillation module 121. The base 12143 of the first NPN transistor 1214 and the base 12153 of the second NPN transistor 1215 form the first oscillating signal output pair 1213 of the first injection-locked cross-couple oscillation module 121.

Besides, a first variable capacitor unit 1216 and a first inductor unit 1217 are arranged in a shunt connection between the collector 12142 of the first NPN transistor 1234 and the collector 12152 of the second NPN transistor 1215. In particular, the first variable capacitor unit 1216 further includes a varactor diode 12161 and a first capacitor operating bias 12162; in addition, the first capacitor operating bias 12162 source is connected to the varactor diode 12161 for adjusting the capacitance of the first variable capacitor unit 1216.

FIG. 3c is an illustration of the second injection-locked cross-coupled oscillation module. As shown in the diagram, the second injection-locked cross-coupled oscillation module 122 further includes a third NPN transistor 1224 and a fourth NPN transistor 1225, wherein the third NPN transistor 1224 has an emitter 12241, a collector 12242 and a base 12243 and the fourth NPN transistor 1225 includes an emitter 12251, a collector 12252 and a base 12253.

Also, the base 12243 of the third transistor 1224 is connected to the collector 12252 of the fourth NPN transistor 1225, the base 12253 of the fourth NPN transistor is coupled to the collector 12242 of the third NPN transistor, the emitter 12241 of the third NPN transistor 1224 is connected to the emitter 12251 of the fourth NPN transistor 1225. It allows the emitter 12241 of the third NPN transistor 1224 and the emitter 12251 of the fourth NPN transistor 1225 to thereby form a second connection node 1220.

In addition, the second connection node 1220 forms the second oscillating signal input terminal 1221 of the second injection-locked cross-coupled oscillation module 122, and the base 12243 of the third NPN transistor 1224 and the base 12253 of the fourth NPN transistor 1225 form the second oscillating signal output pair 1223 of the second injection-locked cross-coupled oscillation module 122.

Besides, a second variable capacitor unit 1226 and a second inductor unit 1227 are connected in series between the collector 12242 of the third NPN transistor 1224 and the collector 12252 of the fourth NPN transistor 1225. Also, the second variable capacitor unit 1226 further includes a varactor diode 12261 and a second capacitor operating bias 12262. The second capacitor operating bias 12262 source is connected to the varactor diode 12261 for adjusting the capacitance of the second variable capacitor unit 1226.

Subsequently, as depicted in FIGS. 3b and 3c, the signal conversion device of the present invention further includes a volt current condenser (Vcc) 15, a ground terminal 150, a first operating current source 151, a first injection-locked signal source 1511, a second operating current source 152 and a second injection-locked signal source 1521.

Specifically, the first operating current source 151 is connected in series between the first connection node 1210 and the ground terminal 150, and the current flow of the first operating current source 151 is from the first connection node 1210 to the ground terminal 150. Also the Vcc 15 and the first injection-locked signal source 1511 are connected to the first inductor unit 1217. The second operating current source 152 is coupled in series between the second connection node 1220 and the ground terminal. In addition, the current flow of the second operating current source 152 is from the second connection node 1220 to the ground terminal 150. Also the Vcc 15 and the second injection-locked signal source 1521 are connected to the second inductor unit 1227.

FIG. 3d shows the block diagram of the first differential amplification module and FIG. 3e shows the block diagram of the second differential amplification module. The second signal output end 13122 of the signal output pair 1312 of the first differential amplification module 131 and the fourth signal output end 13222 of the signal output pair 1322 of the second differential amplification module 132 are connected to the ground terminal 150. Also, a resistor-capacitor unit 133 is respectively connected between the ground terminal 150 and the second signal output end 13122 of the signal output pair 1312 of the first differential amplification module 131, as well as between the ground terminal 150 and the fourth signal output end 13222 of the signal output pair 1322 of the second differential amplification module 132.

Therefore, the operation of the aforementioned signal conversion device is based on the concept of adjusting the coupling oscillating frequency $f_{r1}$ of the cavity of the first injection-locked cross-coupled oscillation module 121 to approximately $f_0/2$ by employing the first variable capacitor unit 1216 and the first inductor unit 1217, however, $f_{r1}$ is greater than $f_0/2$. The second variable capacitor unit 1226 and the second inductor unit 1227 are used to adjust the coupling oscillating frequency $f_{r2}$ of the cavity of the second injection-locked cross-coupled oscillation module 122 to approximately $f_0/2$, however, $f_{r2}$ is less than $f_0/2$.

Subsequently, a BPSK oscillating signal enters the signal distribution module 11, which divides the BPSK oscillating signal. The divided signals of the BPSK signal are then respectively transmitted to the first injection-locked cross-coupled oscillation module 121 and the second injection-locked cross-coupled oscillation module 122 via the first signal distribution output terminal 1121 and the second signal distribution output terminal 1122.

At the same time, a locking signal of an injection frequency of $f_0/2$ is injected at the first injection-locked signal source 1511, and a looking signal of an injection frequency of $f_0/2$ is injected at the second injection-locked signal source 1521, so as to allow the first injection-locked cross-coupled oscillation module 121 and the second injection-locked cross-coupled oscillation module 122 to output the first oscillating signal and the second oscillating signal. The first and second oscillating signals both have the same frequency of $f_0/2$ but of different phases.

Also, the first signal and the second signal are amplified by the first differential amplification module 131 and the second differential amplification module 132, respectively, and then the signal comparison module 14 is employed to form a first combined signal with a signal amplitude of $$A\sqrt{2 + 2\cos\left(\frac{\theta_{s1} - \theta_{s2}}{2}\right)}$$

and a second combined signal with a signal amplitude of $$A\sqrt{2 - 2\cos\left(\frac{\theta_{s1} - \theta_{s2}}{2}\right)}.$$

In particular, A is the input signal amplitude, $\theta_1$ denotes phase of the first oscillating signal output by the first injection-locked cross-coupled oscillation module 121, and $\theta_2$ is the phase of the second oscillating signal output by the second injection-locked cross-coupled oscillation module 122.

Based on the observation of the above two signal amplitudes, we have discovered that the amplitude of the first combined signal is greater than the amplitude of the second combined signal. Furthermore, the ASK modulation mode is then employed for demodulation based on the first combined signal and the second combined signal in order to retrieve the baseband digital information contained in the original input RF signals. In other words, the circuit design as disclosed in the signal demodulation device of the present invention easily outputs the baseband information carried by the original BPSK modulation signal in the ASK signal format, so as to effectively lower the manufacturing cost of the signal conversion device in the passive electronic tag.

Figure 3F:
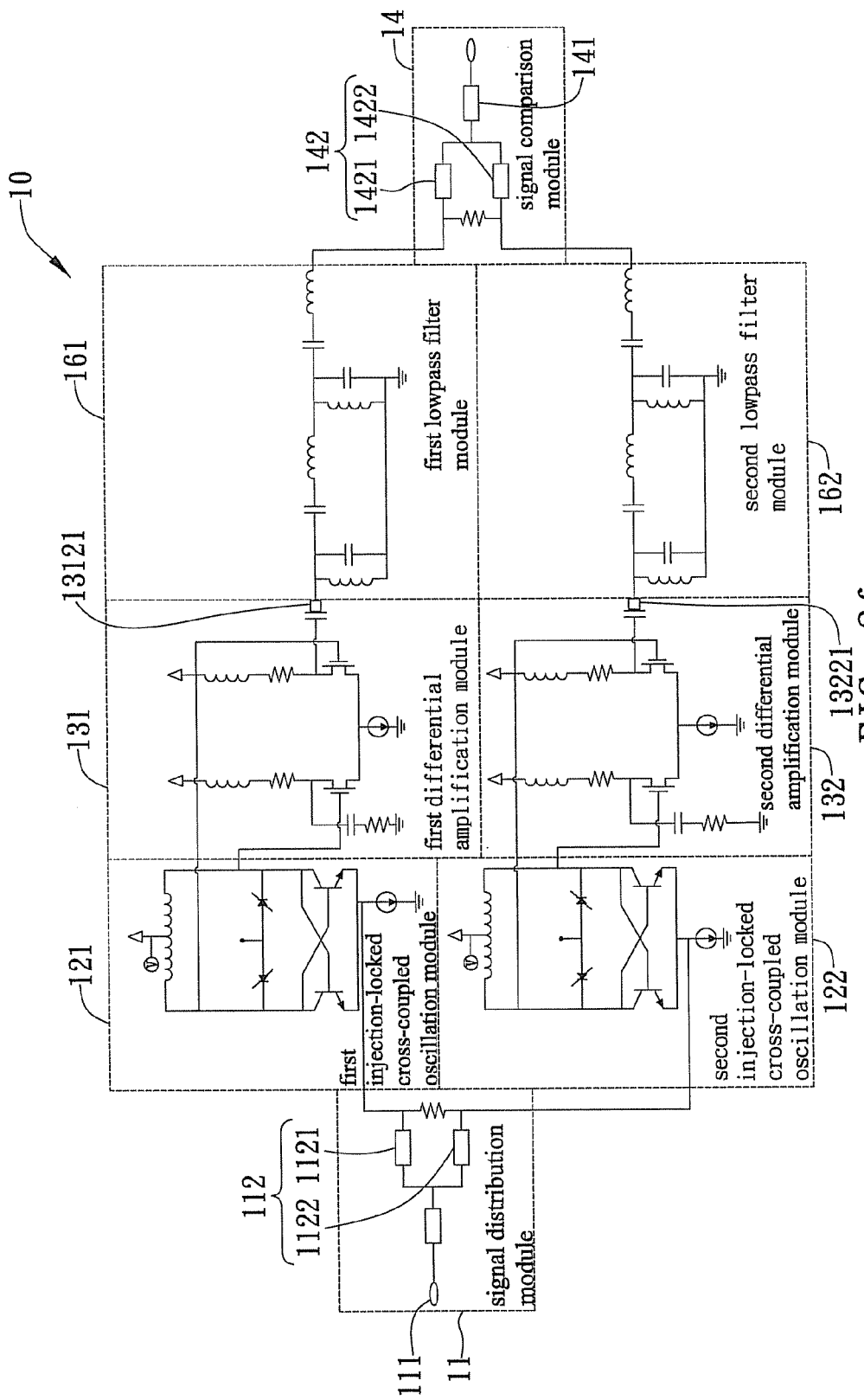
FIG. 3f is a second structure of a signal conversion device of the present invention.

Besides, FIG. 3*f* illustrates a second block diagram of the signal conversion device of the present invention. The signal conversion device 10 of the present invention also includes a first lowpass filter module 161 and a second lowpass module 162.

Specifically, the first lowpass filter module 161 is connected in series between the first signal output end 13121 of the signal output pair 1312 of the first differential amplification module 131 and the signal comparison module 14. Also, the second lowpass filter module 162 is connected in series between the third signal output end 13221 of the signal output pair 1322 of the second differential amplification module 132 and the signal comparison module 14. Furthermore, the first lowpass filter module 161 and the second lowpass filter module 162 enhance the signal quality of the first oscillating signal and the second oscillating signal, respectively.

Figure 3G:
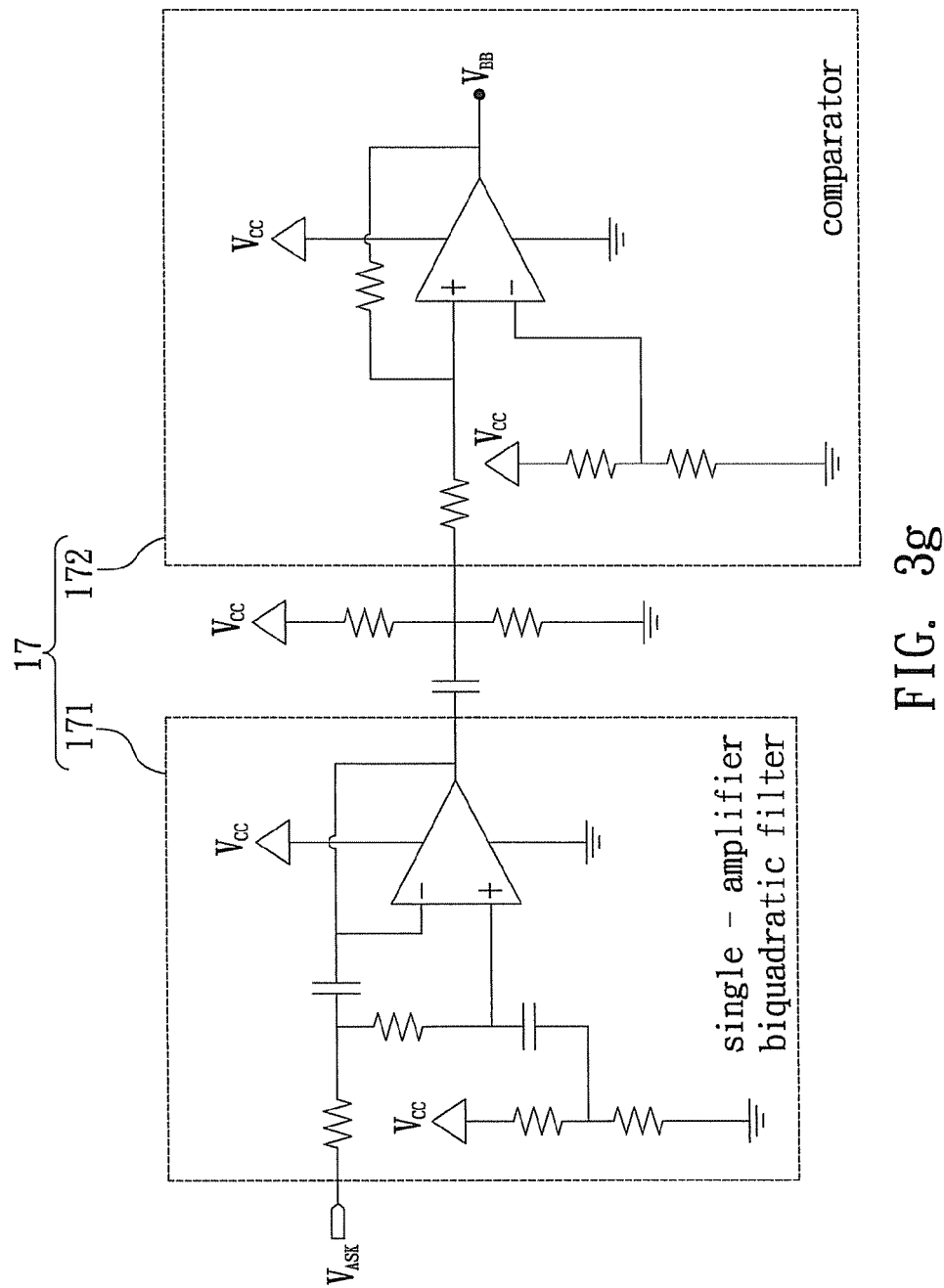
FIG. 3g is a circuit schematic of envelop detection module of the present invention.

Besides, FIG. 3*g* depicts a circuit schematic of a packet detection module of the present invention. The signal conversion device 10 of the present invention further includes the packet detection module 17 that has a single-amplifier biquadratic filter 171 and a comparator 172.

In addition, the packet detection module 17 is connected to the demodulation signal output terminal 141 of the signal comparison module 14 and after receiving the ASK modulation signals generated by the signal comparison module 14, the single-amplifier biquadratic filter 171 then eliminates the carrier signal of the ASK modulation signal. The comparator 172 is employed to adjust the offset of the ASK modulation signal after the removal of carrier signals.

It is known from the above configuration that the signal distribution module 11 of the present invention divides the BPSK signal into two signals of similar strength firsts and then the parallel-connected injection-locked oscillation modules lock the two signals at a specified frequency and phase. Consequently, the signals are amplified and filtered to obtain the offset of the ASK modulation signals. Finally, the signal comparison module 14 is employed to identify the phase conversion of the BPSK signals so as to obtain the information carried.

Next, the present invention discloses an RFID tag structure that employs a signal conversion module, especially the signal conversion as disclosed in the above-mentioned present invention, thereby allowing the following RFID tag to read and analyze the BPSK signal sent from the reader using a low cost and highly efficient circuit design, so as to achieve the effectiveness of a proper identification.

Figure 4:
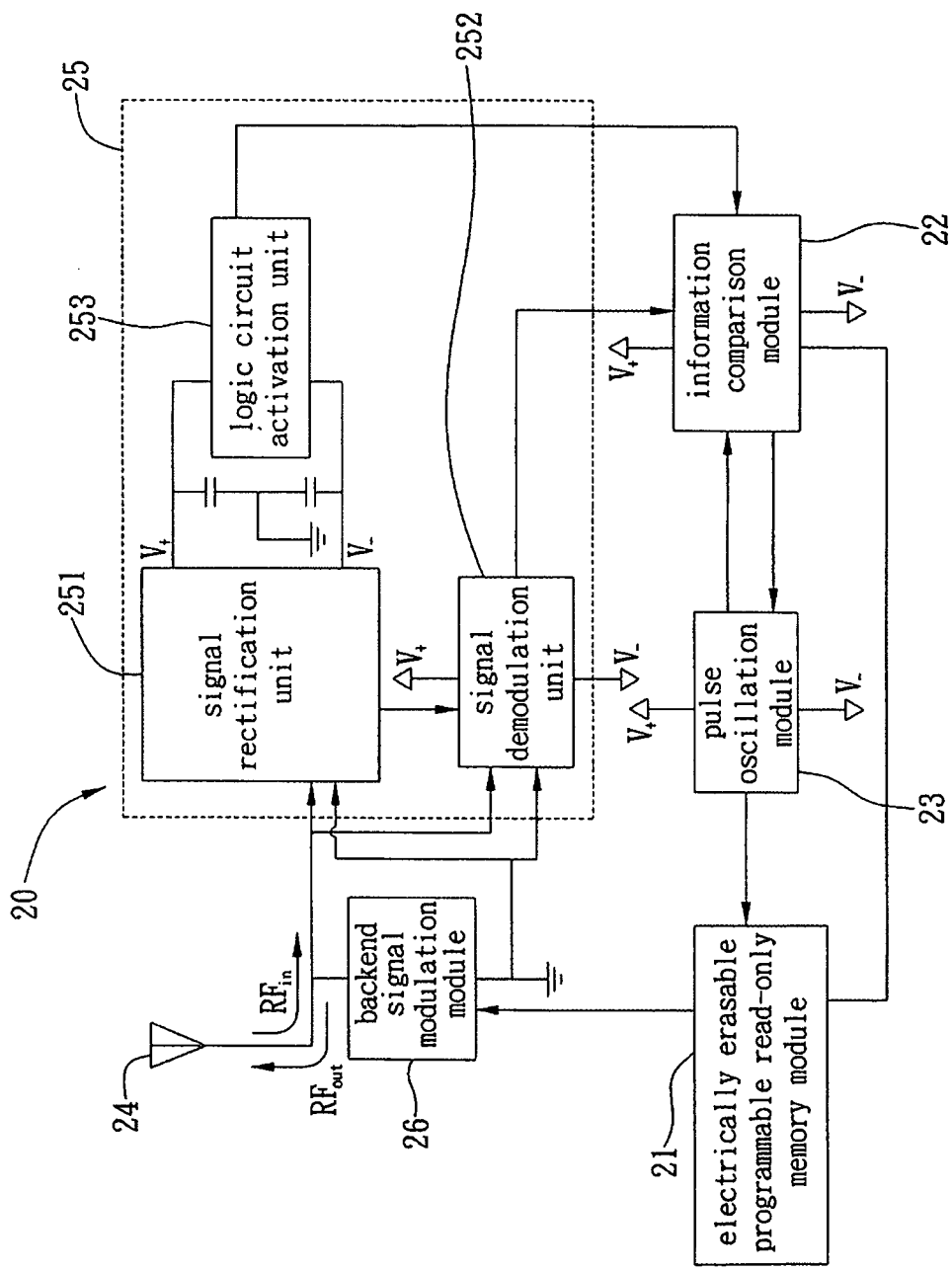
FIG. 4 is a diagram showing the RFID tag structure of the present invention.

FIG. 4 illustrates the RFID tag structure of the present invention. As shown in the diagram, the RFID tag 20 of the present invention includes an electrically erasable programmable read-only memory module 21 for storing RFID tag information, an information comparison module 22, pulse oscillation module 23, a T/R antenna 24, a front-end signal demodulation module 25 and a backend signal modulation module 26. In addition, the front-end signal demodulation module 25 further includes a signal rectification unit 251, a signal demodulation unit 252 and a logic circuit activation unit 253.

The operation structure of the RFID tag 20 involves rectifying a wireless RF signal to a dc voltage by the signal rectification unit 251 after the wireless RF signal is received via the T/R antenna 24. Subsequently, the signal demodulation unit 252 receives the RF signal to then be demodulated into an ASK modulation signal. Also, the signal demodulation unit 252 provides the logic circuit activation unit 253 with a voltage and the energy of the electromagnetic signal is employed to drive the information comparison module 22.

After the information comparison module 22 is activated, a driving signal is generated to drive the pulse oscillation module 23 to activate the electrically erasable programmable read-only memory module 21 for sending the stored RFID tag information to the information comparison module 22 while sending the pulse oscillating signal.

After the information comparison module 22 receives the RFID tag information and the ASK modulation signal sent from the signal demodulation unit 252, the RFID tag information is then compared with the ASK modulation signal. If the comparison is matched, the electrically erasable programmable read-only memory module 21 is initiated to transmit the stored RFID tag information to the backend signal modulation module 26. Subsequently, the backend signal modulation module 26 modulates the RFID tag information into a BPSK modulation signal of the RFID tag information. Finally, the T/R antenna 24 transmits the BPSK modulation signal of the RFID tag information by an electromagnetic signal.

Figure 5A:
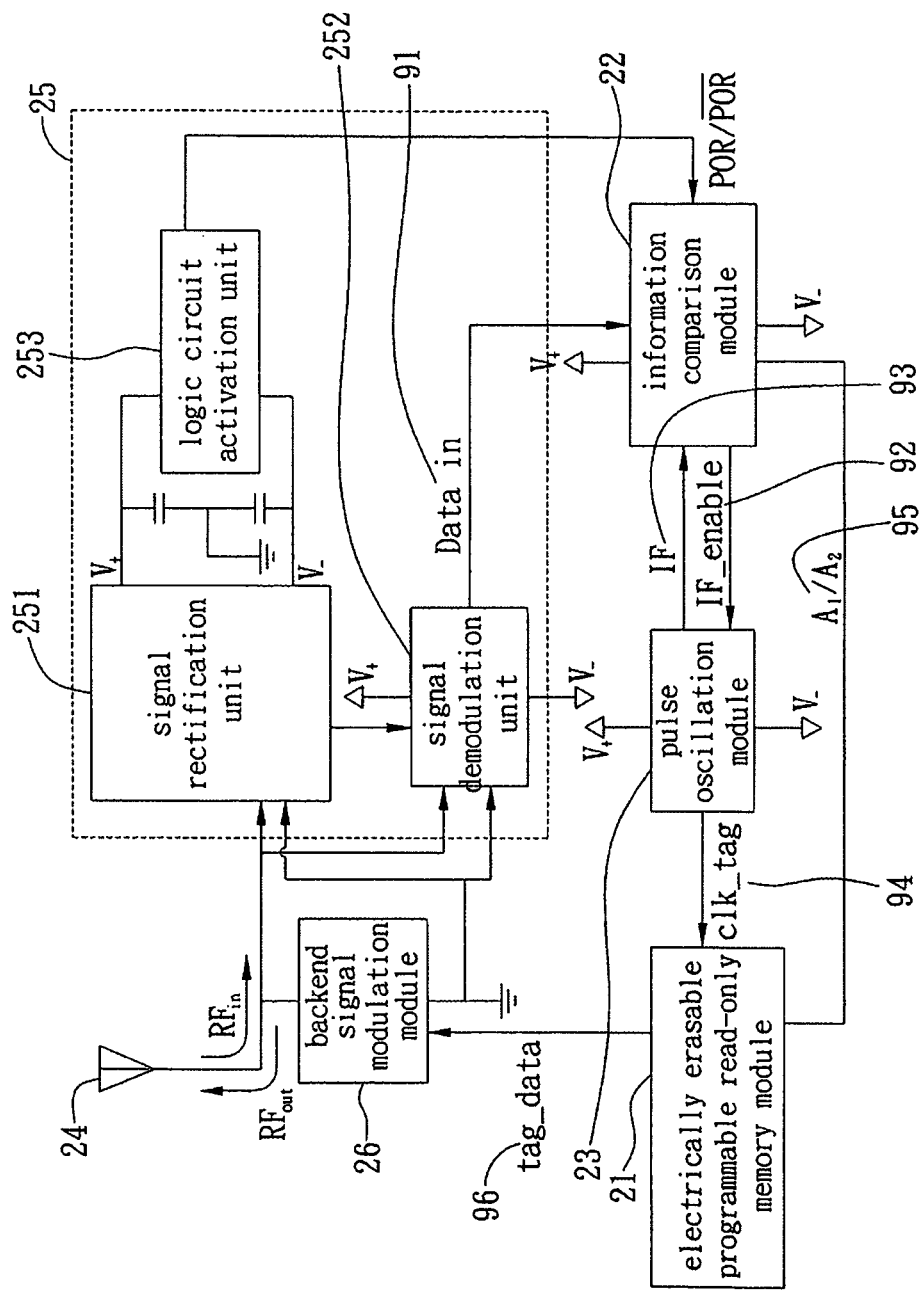
FIG. 5a illustrates the operation of the RFID tag information comparison of the present invention.
Figure 5B:
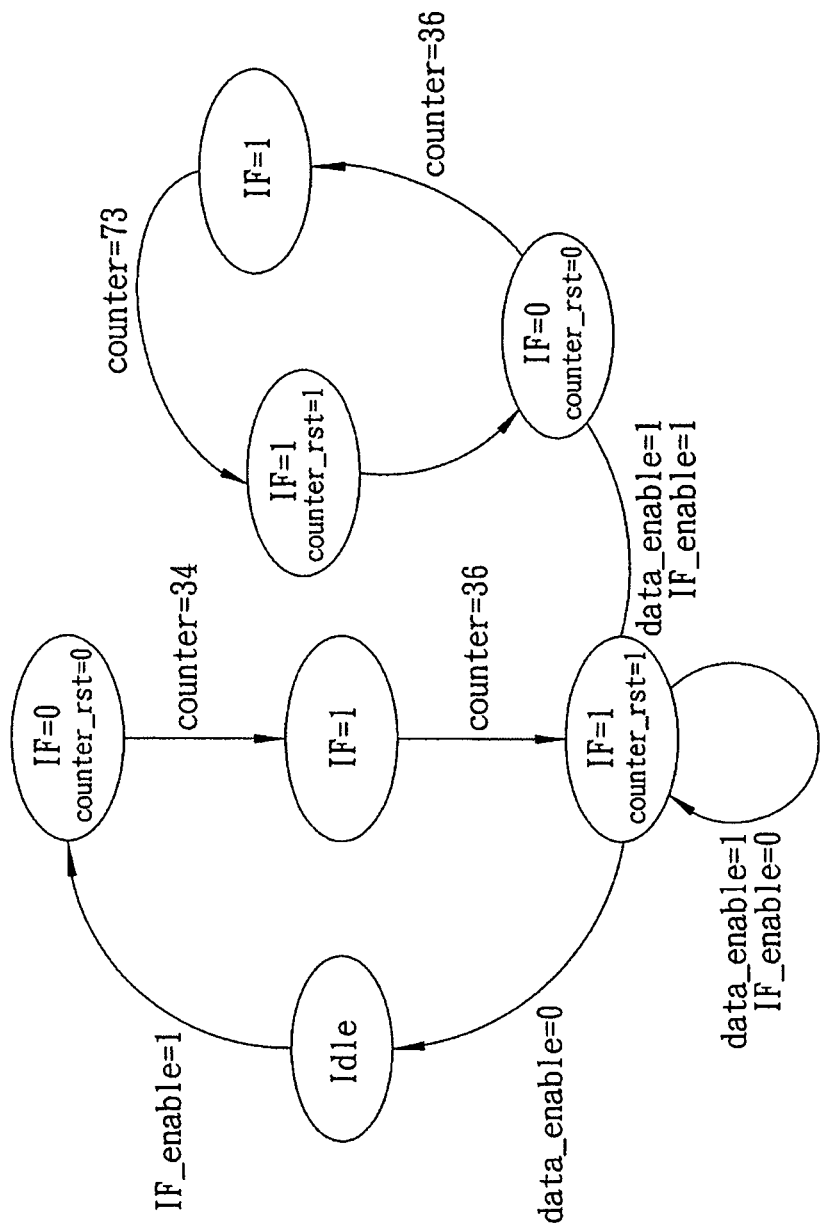
FIG. 5b is a state diagram that illustrates the operation of the pulse oscillation module of the present invention.
Figure 5C:
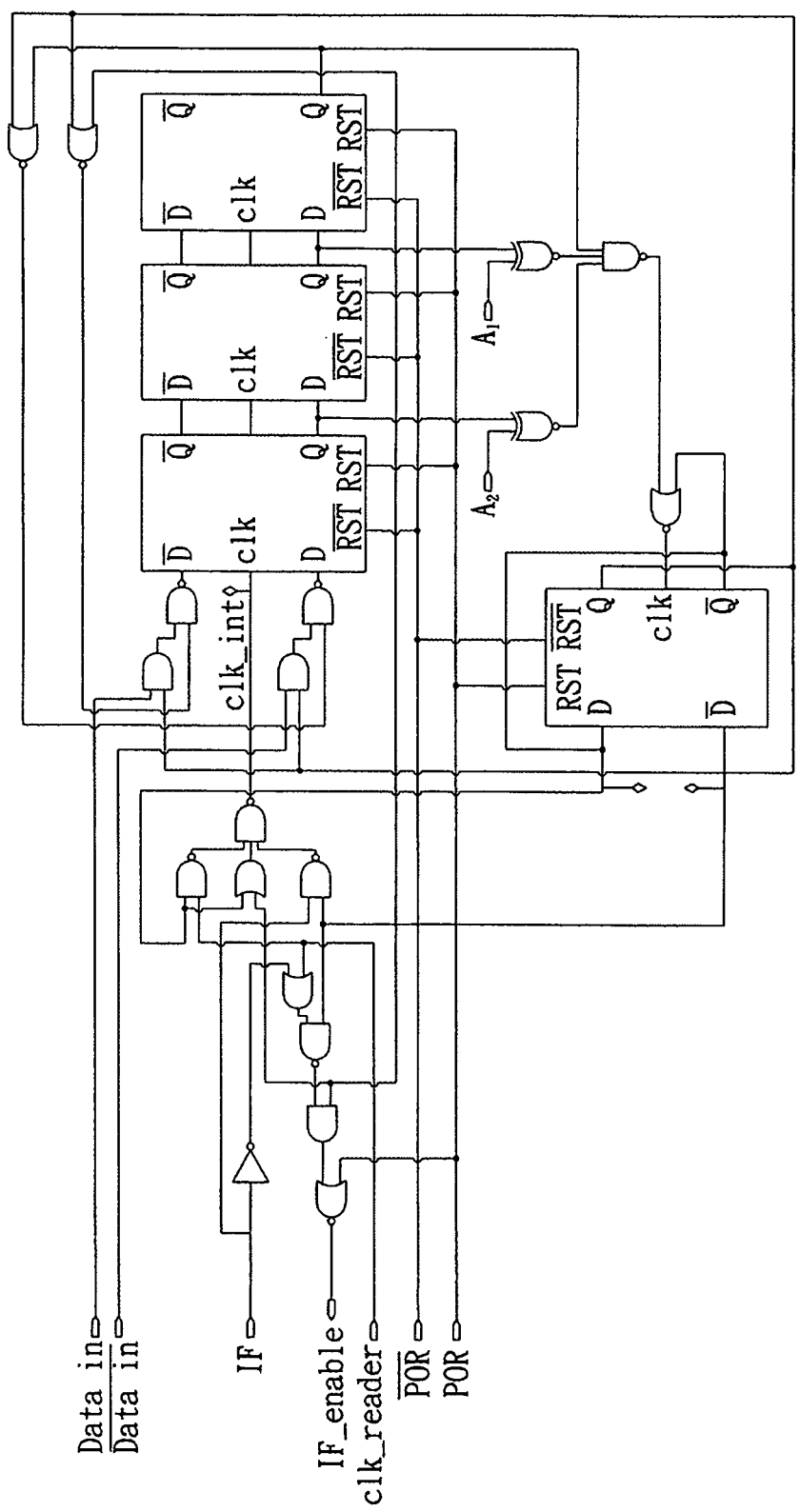
FIG. 5c shows a circuit schematic of the information comparison module of the present invention.

Referring to FIGS. 5a to 5c, FIG. 5a is a diagram showing the operation flow of the RFID tag information of the present invention. FIG. 5b shows the state diagram of the pulse oscillation module operation of the present invention. FIG. 5c illustrates the circuit structure of the information comparison module of the present invention.

As shown in the drawings, the information comparison module 22, upon receiving a data_in demodulation signal 91 sent by the front-end signal demodulation module 25, issues a IF_enable driving signal 92 to activate the pulse oscillation module 23. The pulse oscillation module 23 then sends an IF intermittent pulse signal 93 for operations of the information comparison module 22, and the pulse oscillation module 23 also sends a clk_tag continuous oscillating signal 94 to operate the electrically erasable programmable read-only memory module 21.

However, the electrically erasable programmable read-only memory module 21 sends back the stored $A_1/A_2$ identification information 95 to the information comparison module 22. Subsequently, the circuit structure as shown in FIG. 5c, the circuit schematic of the signal comparison module, performs the comparison between the data_in demodulation signal 91 and the $A_1/A_2$ identification information 95.

If the comparison is matched, data_enable=1 and IF_enable=1, thus the pulse oscillation module 23 continues to generate continuous oscillation for the electrically erasable programmable read-only memory module 21 to continue to read the electronic tag information. Subsequently, a tag_data electronic tag information 96 is sent back to the RFID tag reading device via the backend signal modulation module 26 and the T/R antenna 24. Otherwise if the comparison is unmatched, data_enable=0, and the circuit of the information comparison module 22 is returned to the standby mode.

Figure 6:
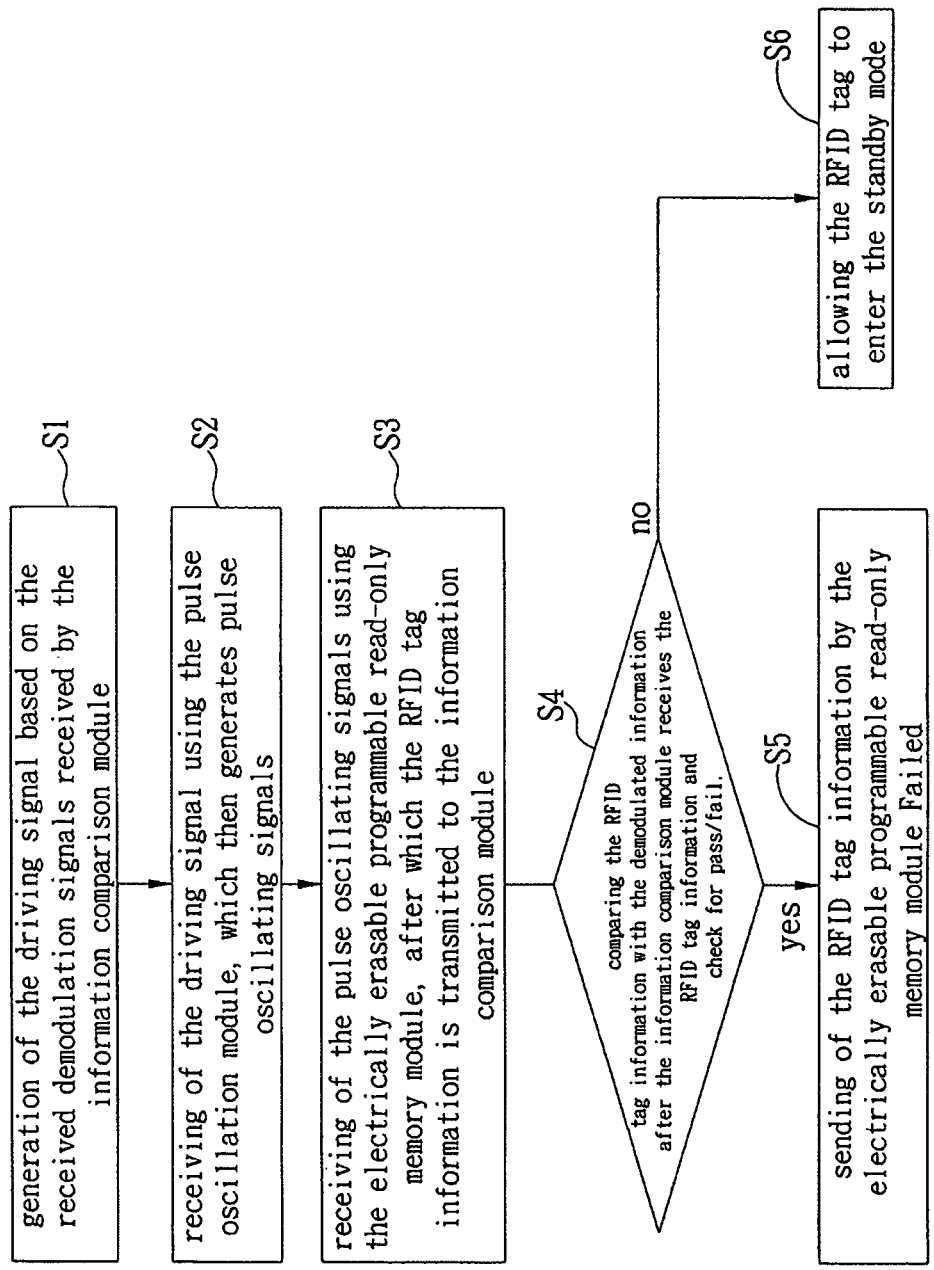
FIG. 6 illustrates a first embodiment of the RFID tag operation method of the present invention.

Finally, FIG. 6 illustrates the method for operating the RFID tag of the present invention, which is a reference for analyzing the method for operating the RFID tag of the present invention. In combination with the above-described circuit operation logic, the method for operating the RFID tag of the present invention includes at least the following steps: firstly, S1 is implemented, wherein the information comparison module generates the driving signal after receiving the demodulation signal. Next, step S2 is preceded.

In step S2, the pulse oscillation module receives the driving signal and generates the pulse oscillating signal.

In step S3, the electrically erasable programmable read-only memory module, after receiving the pulse oscillating signal, transmits the RFID tag information to the information comparison module.

In step S4, after the information comparison module receives the RFID tag information, the RFID tag information is compared with the demodulation signal. If the comparison is matched, step S5 is preceded; otherwise if the comparison is unmatched, step S6 is preceded.

In step S5, the electrically erasable programmable read-only memory module transmits the RFID tag information. (There is an extra word "Failed" at the end of S5)

Step S6, finally the RFID tag is set into the standby mode.

Figure 7:
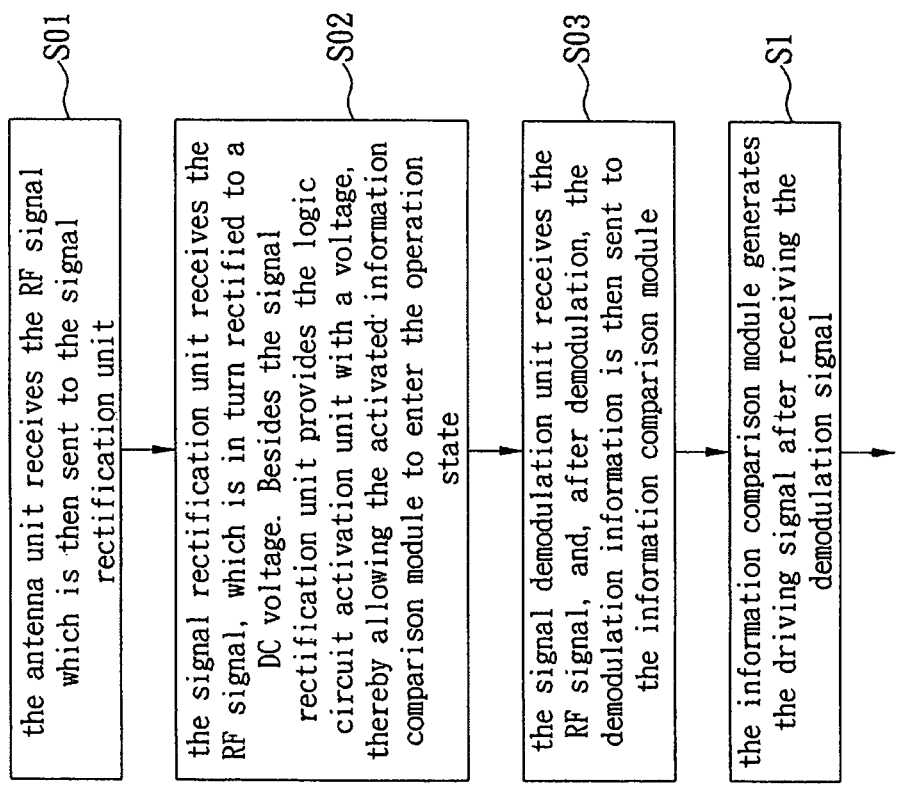
FIG. 7 illustrates a second embodiment of the RFID tag operation method of the present invention.

FIG. 7 is a second embodiment of the method for operating the RFID tag of the present invention. Prior to implementing the second embodiment of the method for operating the RFID tag of the present inventions the following steps are carried out. In step S01, the antenna unit receives the RF signal which is then sent to the signal rectification unit. Next, step S02 is preceded.

In step S02, the signal rectification unit receives the RF signal, which is in turn rectified to a dc voltage. Besides, the signal rectification unit provides the logic circuit activation unit with a voltage to thereby allow the activated information comparison module to enter the operation state. After that, step S03 is carried out.

In step S03, the signal demodulation unit receives the RF signal, and, after demodulation, the demodulation information is sent to the information comparison module.

Figure 8:
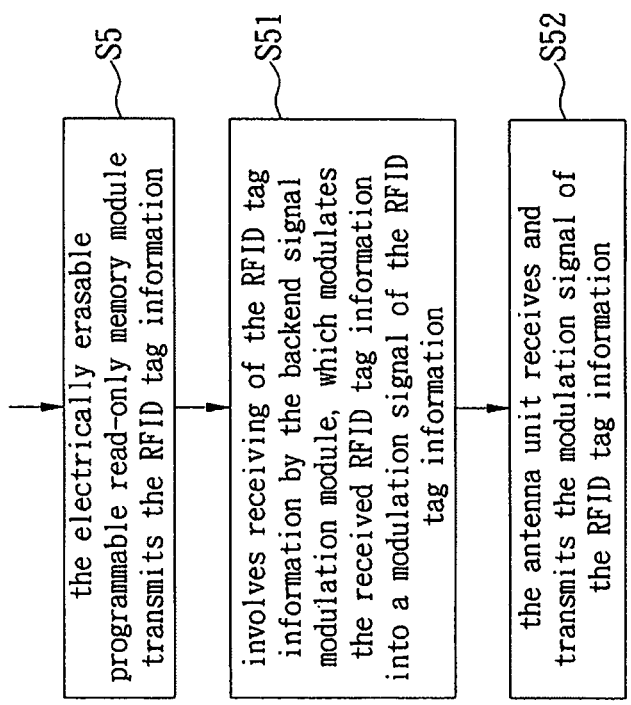
FIG. 8 illustrates a third embodiment of the RFID tag operation method of the present invention.

FIG. 8 is a third embodiment of the method for operating the RFID tag of the present invention. The third embodiment of the method for operating the RFID tag of the present invention, after implementing step S5, further includes step S51 of having the backend signal modulation receiving the RFID tag information and modulate the received RFID tag information into a modulation signal of the RFID tag information. Then, step S52 is proceeded.

In step S52, the antenna unit receives and transmits the modulation signal of the RFID tag information.

According to the above, the RFID tag and the method for operating the same as disclosed in the present invention, after the RFID tag receives the RF signal, employ the signal demodulation module to generate the demodulation information, and the demodulation information is compared with the information stored in the RFID tag. If the comparison is matched, the RFID tag then transmits the tag information to the reader via a wireless signal transmission means; otherwise, if the comparison is unmatched, the RFID tag is set into the standby mode. In summary, the RFID tag and the method for operating the same as disclosed in the present invention provide a simple, correct and fast RFID tag circuit design, thereby lowering the RFID tag manufacturing cost significantly and raising the possibility of the commercialization of the passive RFID tag.

The foregoing embodiments and advantages are merely exemplary and are not to be construed as limiting the present invention. It will be understood that variations and modifications can be effected thereto by those skilled in the art without departing from the spirit and scope of the invention as defined by the appended claims.

What is claimed is:

1. A signal conversion device, comprising:
 a signal distribution module;
 a first and a second injection-locked cross-coupled oscillation modules each comprising an oscillating signal input terminal, a locking signal input terminal and an oscillating signal output pair, wherein the two oscillating signal input terminals are respectively coupled to the signal distribution module;
 a first and a second differential amplification modules each having a signal input pair and a signal output pair, wherein the signal input pair of the first differential amplification module is coupled to the oscillating signal output pair of the first injection-locked cross-coupled oscillation module, and the signal input pair of the second differential amplification module is coupled to the oscillating signal output pair of the second injection-locked cross-coupled oscillation module; and
 a signal comparison module coupled to one signal output end of the signal output pair of the first differential amplification module and one signal output end of the signal output pair of the second differential amplification module, for comparing output signals of the two signal output ends so as to generate ASK modulation signals, wherein the first injection-locked cross-coupled oscillation module further comprises a first NPN transistor and a second NPN transistor each having a base, a collector and an emitter, allowing the base of the first NPN transistor to be coupled to the collector of the second NPN transistor, the base of the second NPN transistor to be coupled to the collector of the first NPN transistor, and the emitter of the first NPN transistor to be coupled to the emitter of the second NPN transistor to form a first connection node, and wherein the second injection-locked cross-coupled oscillation module further comprises a third NPN transistor and a fourth NPN transistor each having a base, a collector and an emitter, allowing the base of the third NPN transistor to be coupled to the collector of the fourth NPN transistor, the base of the fourth NPN transistor to be coupled to the collector of the third NPN transistor, and the emitter of the third NPN transistor to be coupled to the emitter of the fourth NPN transistor to form a second connection node.

2. The signal conversion device of claim 1, further comprising a first capacitor unit and a first inductor unit connected in parallel between the collector of the first NPN transistor and the collector of the second NPN transistor.

3. The signal conversion device of claim 2, wherein the first capacitor unit comprises a variable capacitor unit comprising a varactor diode and a first capacitor operating bias voltage source coupled to the varactor diode to adjust a capacitance of the variable capacitor unit.

4. The signal conversion device of claim 2, further comprising a volt current condenser (Vcc) coupled to the first inductor unit, a ground terminal, a first operating current source connected in series between the first connection node and the ground terminal, and a first injection-locked signal source coupled to the first inductor unit, wherein a current of the first operating current source is allowed to flow in a direction from the first connection node to the ground terminal.

5. The signal conversion device of claim 1, further comprising a second capacitor unit and a second inductor unit connected in parallel between the collector of the third NPN transistor and the collector of the fourth NPN transistor.

6. The signal conversion device of claim 5, further comprising a volt current condenser (Vcc) coupled to the second inductor unit, a ground terminal connected to the other signal output end of the signal output pair of the first differential amplification module and the other signal output end of the signal output pair of the second differential amplification module, a second operating current source connected in series between the second connection node and the ground terminal, and a second injection-locked signal source coupled to the second inductor unit, wherein a current of the second operating current source is allowed to flow in a direction from the second connection node to the ground terminal.

7. The signal conversion device of claim 6, further comprising a resistor-capacitor unit coupled between the other signal output end of the signal output pair of the first differential amplification module and the ground terminal as well as between the other signal output end of the signal output pair of the second differential amplification module and the ground terminal.

8. The signal conversion device of claim 1, further comprising a first lowpass filter module connected in series between the one signal output end of the signal output pair of the first differential amplification module and the signal comparison module, and a second lowpass filter module connected in series between the one signal output end of the signal output pair of the second differential amplification module and the signal comparison module.

9. The signal conversion device of claim 1, further comprising a packet detection module coupled to the signal comparison module for receiving the ASK modulation signals transmitted from the signal comparison module.

10. The signal conversion device of claim 9, wherein the envelope detection module comprises a single-amplifier biquadratic filter for filtering out carrier signals of the ASK modulation signals, and a comparator for adjusting a signal offset of the ASK modulation signals with the carrier signals being filtered out.

* * * * *